United States Patent
Sasaki et al.

(10) Patent No.: US 7,192,854 B2
(45) Date of Patent: Mar. 20, 2007

(54) METHOD OF PLASMA DOPING

(75) Inventors: Yuichiro Sasaki, Tokyo (JP); Bunji Mizuno, Nara (JP); Ichiro Nakayama, Osaka (JP); Hisataka Kanada, Osaka (JP); Tomohiro Okumura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 164 days.

(21) Appl. No.: 10/532,768

(22) PCT Filed: Nov. 18, 2003

(86) PCT No.: PCT/JP03/14633

§ 371 (c)(1),
(2), (4) Date: Apr. 27, 2005

(87) PCT Pub. No.: WO2004/051720

PCT Pub. Date: Jun. 17, 2004

(65) Prior Publication Data

US 2005/0287776 A1    Dec. 29, 2005

(30) Foreign Application Priority Data

Nov. 29, 2002    (JP) .............................. 2002-347177

(51) Int. Cl.
*H01L 21/42* (2006.01)
*H01L 21/26* (2006.01)

(52) U.S. Cl. ............................... 438/513; 257/E21.316
(58) Field of Classification Search ........ 257/E21.316; 438/513
See application file for complete search history.

(56) References Cited

U.S. PATENT DOCUMENTS

| 6,403,410 B1* | 6/2002 | Ohira et al. ................. 438/181 |
| 6,784,080 B2* | 8/2004 | Mizuno et al. ............. 438/510 |
| 2006/0238133 A1* | 10/2006 | Horsky et al. .......... 315/111.81 |

FOREIGN PATENT DOCUMENTS

| EP | 1 054 433 | 11/2000 |
| JP | 10-12890 | 1/1998 |
| JP | 2000-114198 | 4/2000 |
| JP | 2002-170782 | 6/2002 |
| WO | 02/080254 | 10/2002 |

OTHER PUBLICATIONS

Bunji Mizuno et al., "Plasma Doping into the Side-Wall of a Sub-0.5 μm Width Trench", Extended Abstracts of the 19th Conference on Solid State Devices and Materials, Tokyo, 1987, pp. 319-322.

* cited by examiner

*Primary Examiner*—Asok Kumar Sarkar
(74) *Attorney, Agent, or Firm*—Wenderoth, Lind & Ponack, L.L.P.

(57) ABSTRACT

A method of plasma doping in which dilution of $B_2H_6$ is maximized for enhanced safety and stable plasma generation and sustention can be carried out without lowering of doping efficiency and in which the amount of dopant injected can be easily controlled. In particular, a method of plasma doping characterized in that $B_2H_6$ gas is used as a material containing doping impurity while He is used as a substance of high dissociation energy and that the concentration of $B_2H_6$ in mixed gas is less than 0.05%.

11 Claims, 5 Drawing Sheets

METHOD OF PLASMA DOPING

THIS APPLICATION IS A U.S. NATIONAL PHASE APPLICATION OF PCT INTERNATIONAL APPLICATION PCT/JP2003/014633.

TECHNICAL FIELD

The present invention relates to method of doping substances near the surface of solids, using plasma.

BACKGROUND ART

The prior art is described with reference to FIGS. 5A and 5B. This is cited from an article released in SSDMS7 (Extended Abstract of Conference on Solid State Device and Materials, p. 319, Tokyo, 1987, Japan Society of Applied Physics). In the prior art, gas supplied to a plasma source is $B_2H_6$ diluted to 0.05% by He.

As shown in FIG. 5A, silicon wafer 20 is loaded into reactor chamber 10. After reducing the pressure to $5 \times 10^{-7}$ torr ($6.7 \times 10^{-5}$ Pa), $B_2H_6$ gas 30 diluted to 0.05% by He is introduced to attain $5 \times 10^{-4}$ torr (0.067 Pa). Under these conditions, power is applied to ECR plasma source 40 to induce high-frequency waves and generate plasma 45. RF power supply 60 then feeds high-frequency waves to wafer susceptor 50 on which wafer 20 is placed. Thus, generates a certain voltage, approximately 700 V according to the cited article, between generated plasma 45 and silicon wafer 20. As a result, positive ion 70 in plasma which contains positive ion 70 and electron 80 is attracted and doped near the surface of wafer 20. In the cited example, the B atom in $B_2H_6$ becomes a source of positive charge (a positive hole) in the silicon and the B atom is called a dopant.

In the cited example, the purpose of diluting $B_2H_6$ by He is an attempt to increase the safety of $B_2H_6$, which is extremely toxic. However, as the partial pressure of $B_2H_6$ falls, the density of ions containing B in plasma also falls, resulting in a significant drop in doping efficiency.

Helium used for dilution has small atomic radius, and is employed for dilution because it diffuses outwardly and is removed easily by thermal treatment even after doping He to silicon. However, He's high ionization energy makes it unsuitable for generating and maintaining plasma in some cases.

Moreover, the use of He hinders the controllability of the dopant implantation amount.

Accordingly, such a plasma doping method is needed as: securing higher safety of handling $B_2H_6$, which is extremely hazardous to the human body due to its high toxicity, by dilution of $B_2H_6$ as far as possible; preventing reduction of doping efficiency; generating and maintaining plasma stably; and facilitating the control of dopant implantation amount.

DISCLOSURE OF INVENTION

The plasma doping method of the present invention uses a larger amount of a substance with high ionization energy than a substance containing impurities to be doped.

DETAILED DESCRIPTION OF PREFERRED EMBODIMENT

Figure 1:
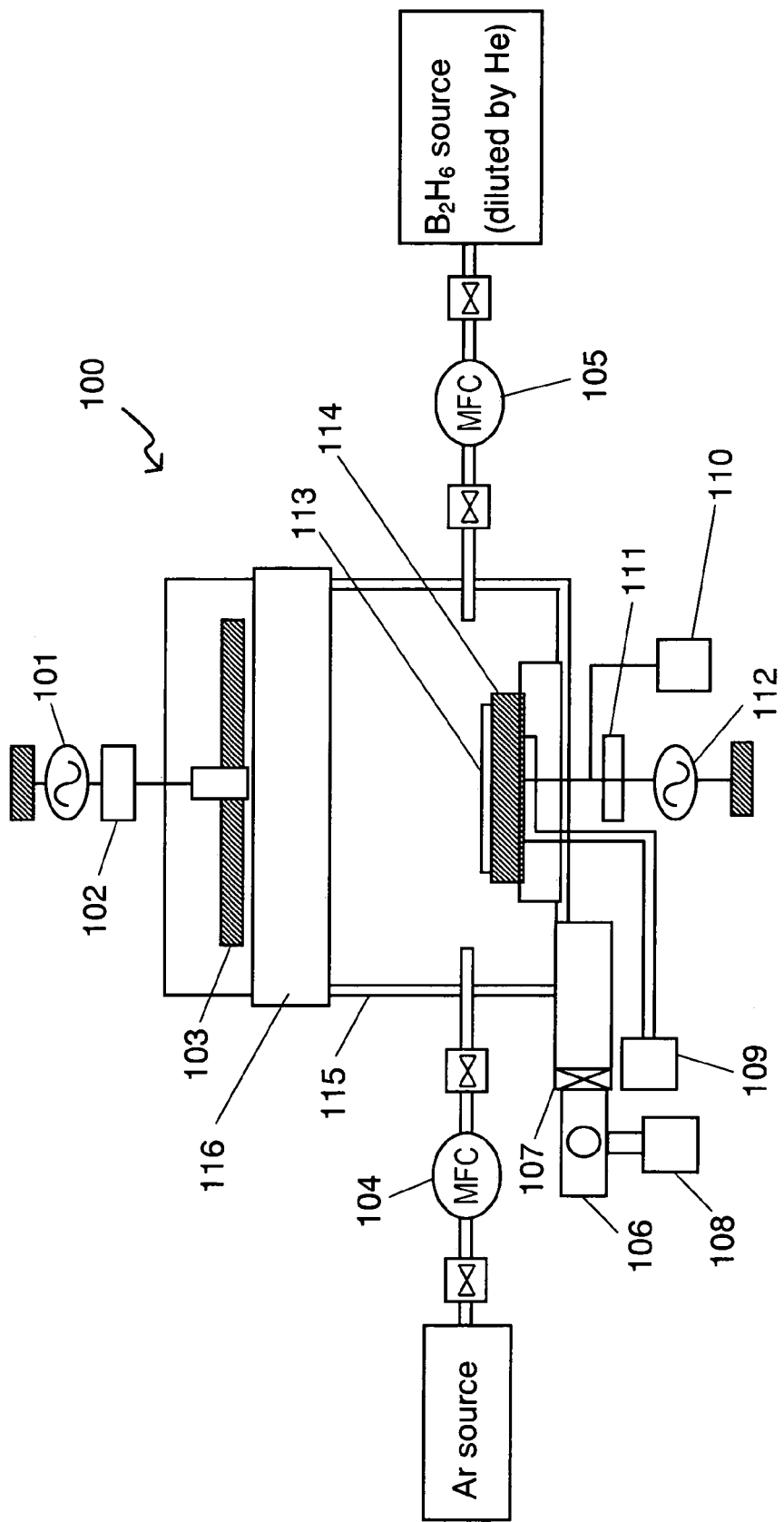
FIG. 1 is a plasma-doping apparatus illustrating an embodiment of the present invention.

A plasma doping method of the present invention uses a larger amount of a substance with higher ionization energy than a substance containing impurities. This makes feasible the doping of plasma with a higher ion current density and electron temperature. More specifically, $B_2H_6$ gas is used as a substance containing impurities to be doped and He is used as a substance with high ionization energy. The concentration of $B_2H_6$ is preferably below 0.05%. In this combination, plasma containing $B_2H_6$ achieves a higher ion current density and electron temperature under a predetermined pressure. Although the ion current density and electron temperature increase as the concentration of $B_2H_6$ falls, the density and temperature are close to saturation at a concentration of less than 0.05%, and thus this concentration is preferable.

The plasma doping method of the present invention generates plasma of substance having lower ionization energy than the substance containing impurities, prior to generating the plasma of the substance containing impurities to be doped. The substance containing impurities to be doped is then discharged so that the state of plasma at generating plasma containing impurities to be doped can be stabilized. Still more, plasma doping is achievable by discharging the substance containing impurities to be doped under lower pressure than in the case without generating a substance with small ionization energy in advance. Accordingly, plasma doping which is unlikely to cause deposition is made feasible. More specifically, at least one of $B_2H_6$, $BF_3$ and $B_{10}H_{14}$ as the substance containing impurities to be doped, and at least one of Ar, H, N, O, Kr, Xe, Cl, $H_2$, NO, $N_2$, $O_2$, CO, $CO_2$, $H_2O$, $SF_6$, $Br_2$ and $Cl_2$ as the substance with small ionization energy are selected for use.

The use of the plasma doping method of the present invention results in a stable plasma with an electron temperature of 6.0 eV or higher when the pressure is approximately 0.9 Pa and ion current density is 1.1 mA/cm$^2$ or higher. The use of such plasma in the plasma doping method of the present invention allows control of a dose by changing the time of application of bias voltage. One advantage is the easy control of a dose while securing the throughput required for industrial use, even when the absolute value of the bias voltage is small. In addition, deposition is unlikely to occur.

Furthermore, when applying plasma doping while changing the pressure during the generation of plasma, $B_2H_6$ is the substance containing impurities to be doped and He is the diluent. In this case, dilution of $B_2H_6$ is preferably centered on n=0.04/P and preferably doped within the range of ±25% when n is the percentage (%) of dilution by He and P is the pressure (Pa) during generation of the plasma. More specifically, doping within the dilution range of 1.25×n to 0.75×n (%) is preferable depending on pressure P.

The use of the plasma doping method of the present invention enhances safety by diluting $B_2H_6$ which is extremely toxic to the human body. In addition, plasma with a higher ion current density and electron temperature is achievable under a predetermined pressure as plasma containing impurities to be doped. Still more, the state of plasma can be stabilized while it is being generated. Still more, plasma doping is achievable through discharging the substance containing impurities to be doped at lower pressure than that without preliminary generation of plasma of the substance with small ionization energy. This achieves plasma doping which is unlikely to cause deposition. Accordingly, the present invention offers an impurity doping method that allows easy control of a dose while securing the throughput required for industrial use even when the absolute value of the bias voltage is low.

Details of the present invention are described below with reference to a preferred embodiment.

1. Plasma-Doping Apparatus

First, the apparatus used in the present invention is described with reference to FIG. 1.

Apparatus 100 includes high-frequency power supply 101 for generating plasma and matching box 102 for adjusting electric discharge. High-frequency power is supplied via a coil and antenna 103. Glass member 116, typically made of quartz glass, maintains vacuum in chamber 115 and transmits generated electromagnetic waves to chamber 115.

Required gas is supplied from Ar gas source or $B_2H_6$ gas source to reactor chamber 115 through mass flow controller 104 or 105. The degree of vacuum in reactor chamber 115 is controlled by aforementioned mass flow controllers 104 and 105, turbo pump 106, conductance pump 107 and dry pump 108. RF or DC power supply 110 feeds the power to reactor chamber 115 through matching box 111. Target 113 is placed on susceptor 114 inside reactor chamber 115, and aforementioned power is supplied.

2. Pressure

A mixture of 0.625% $B_2H_6$ gas and 99.375% He gas is used in an experiment for generating helicon plasma. The source power of the helicon wave is set to 1500 W, and the pressure range for generating mixed plasma of $B_2H_6$ and $H_2$ is investigated by changing the pressure. Electric discharge occurs when the pressure is 2.25 Pa or higher, and thus mixed plasma of $B_2H_6$ and He is achieved. No electric discharge occurs at pressure lower than 2.25 Pa.

The next experiment is to introduce Ar gas into reactor chamber 115, apply the source power, and generate Ar plasma by electric discharge. Helium gas is then introduced and at the same time the Ar gas supply is stopped to generate He plasma. After these steps, $B_2H_6$ gas is introduced to generate mixed plasma of He and $B_2H_6$. This experiment is implemented while changing pressure to investigate the pressure range that allows the generation of mixed plasma of He and $B_2H_6$. The result reveals that stable electric discharge is feasible when the pressure is 0.8 Pa or higher.

Next, another experiment is implemented using a gas mixture of 0.025% $B_2H_6$ gas and 99.975% He gas, and a helicon-wave source power of 1500 W. Due to the limitations of the apparatus, pressures higher than 2.6 Pa are not tested, but no electric discharge occurs at 2.6 Pa or lower. For comparison purposes, the next experiment is implemented. Ar gas is introduced into reactor chamber 115 and then source power is applied to create an electric discharge to generate Ar plasma. Then, He plasma is generated by introducing He gas and stopping the Ar gas supply simultaneously. After these steps, $B_2H_6$ gas is introduced so as to generate mixed plasma of He and $B_2H_6$. In this case, a stable electric discharge is achieved when the pressure is 0.8 Pa or higher.

As described above, $B_2H_6$ gas is used as the substance containing impurities to be doped and Ar gas is used as the substance with small ionization energy. Plasma of the substance having smaller ionization energy than the substance containing impurities is generated prior to generating plasma of the substance containing impurities to be doped. The substance containing impurities to be doped is discharged finally. This procedure enables the generation of mixed plasma of He and $B_2H_6$ at lower pressure than in the case without preliminary discharge of the substance with small ionization energy.

3. Ion Current Density

Figure 2:
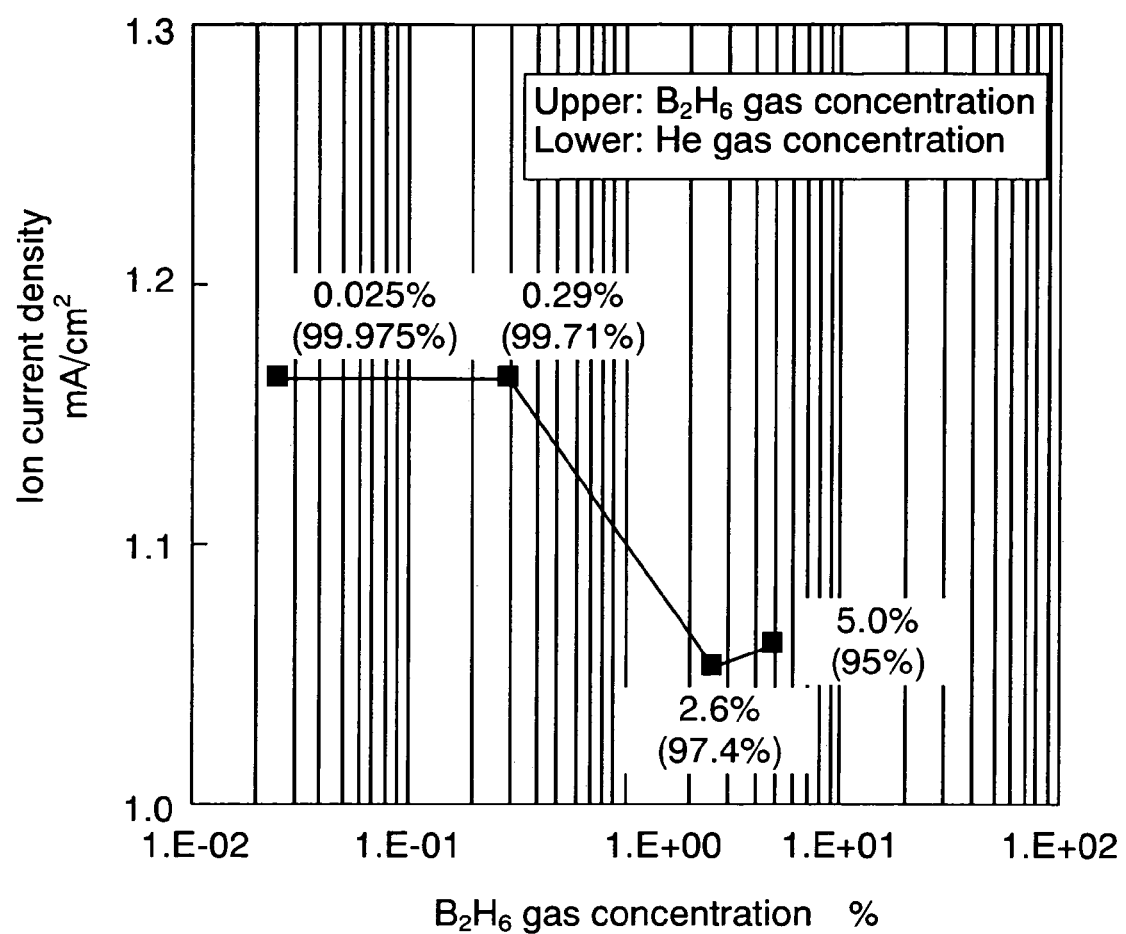
FIG. 2 is a graph illustrating dependency of ion current density on the $B_2H_6$ gas concentration in the embodiment of the present invention.

FIG. 2 shows changes in the ion current density when a helicon plasma is generated while changing the mixing ratio of $B_2H_6$ gas and He gas. The vertical axis indicates the current density, and the horizontal axis indicates the $B_2H_6$ gas concentration in the gas mixture of $B_2H_6$ gas and He gas. Numbers in brackets on the horizontal axis indicate the He gas concentration. Pressure is set to 0.9 Pa in the experiment. As the concentration of $B_2H_6$ gas falls, the ion current density begins to increase sharply when the $B_2H_6$ gas concentration fells below 1%. When the $B_2H_6$ gas concentration is 5% and 2.6%, the ion current density is less than 1.1 $mA/cm^2$. In contrast, the ion current density is 1.1 $mA/cm^2$ or above when the concentration is 0.29% and 0.025%.

As shown in FIG. 2, the ion current density changes sharply at around 0.5%. This is evidence of the useful effect of achieving plasma with a high ion current density by holding the $B_2H_6$ gas concentration below 0.5% using the helicon plasma source. This steep change in ion current density at the $B_2H_6$ gas concentration below 0.5% with the use of helicon plasma source is a remarkable effect that is not disclosed in the prior art.

4. Electron Temperature

Figure 3:
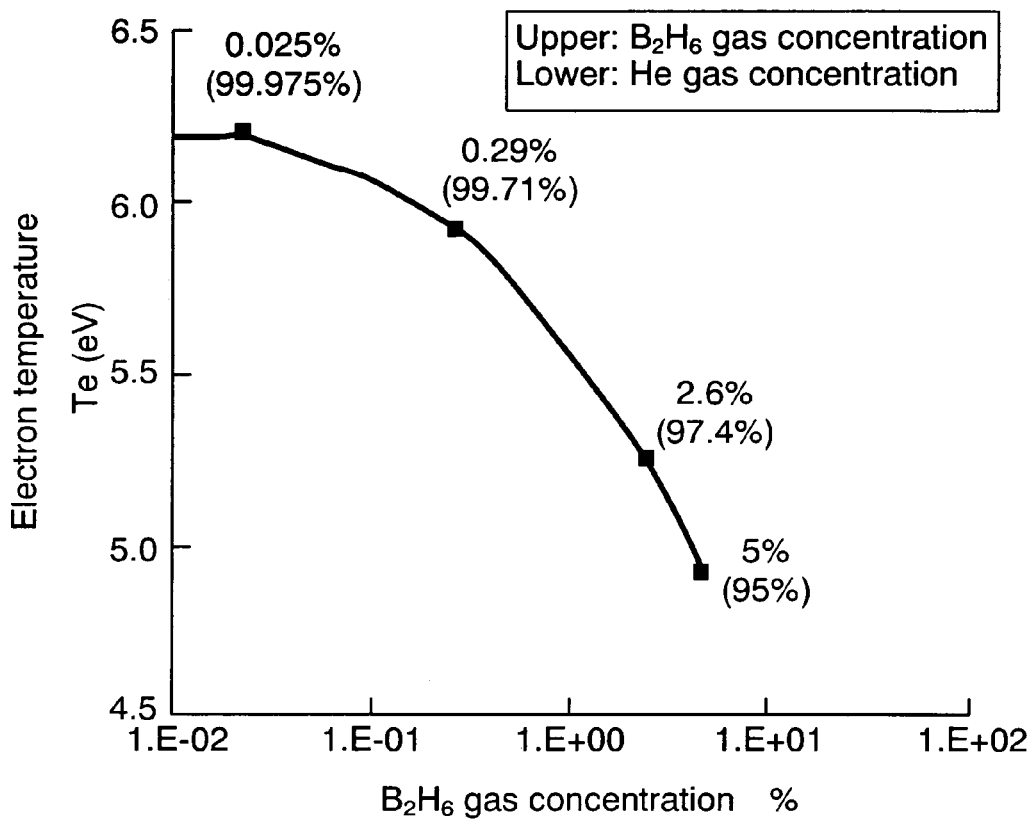
FIG. 3 is a graph illustrating dependency of electron temperature on the $B_2H_6$ gas concentration in the embodiment of the present invention.

FIG. 3 shows changes in the electron temperature when the mixing ratio of $B_2H_6$ gas and He gas is changed. The vertical axis indicates electron temperature Te (eV), and the horizontal axis indicates the concentration of $B_2H_6$ gas in the gas mixture of $B_2H_6$ gas and He gas. Numbers in brackets on the horizontal axis indicate the He gas concentration. Helicon plasma is used under a pressure of 0.9 Pa in the experiment. The results show that the electron temperature increases as the concentration of $B_2H_6$ gas falls, and the temperature saturates when the $B_2H_6$ gas concentration is 0.025%. The electron temperature stays below 6.0 eV when the $B_2H_6$ gas concentration is 0.29% or higher. In contrast, the electron temperature exceeds 6.0 eV when the concentration is 0.025%.

5. Controllability of a Dose

Plasma doping is applied to a n-Si (100) wafer using two types of mixed plasma of $B_2H_6$ and He: $B_2H_6$ gas concentration of 0.025% and 0.29%. The bias voltage is −60 V and pressure is 0.8 Pa. After plasma doping, the wafer is annealed for three minutes at 1100° C. The sheet resistance is then measured using the four-probe method. The dose of boron in a specimen created using 0.025% $B_2H_6$ gas is measured using SIMS after plasma doping.

Figure 4:
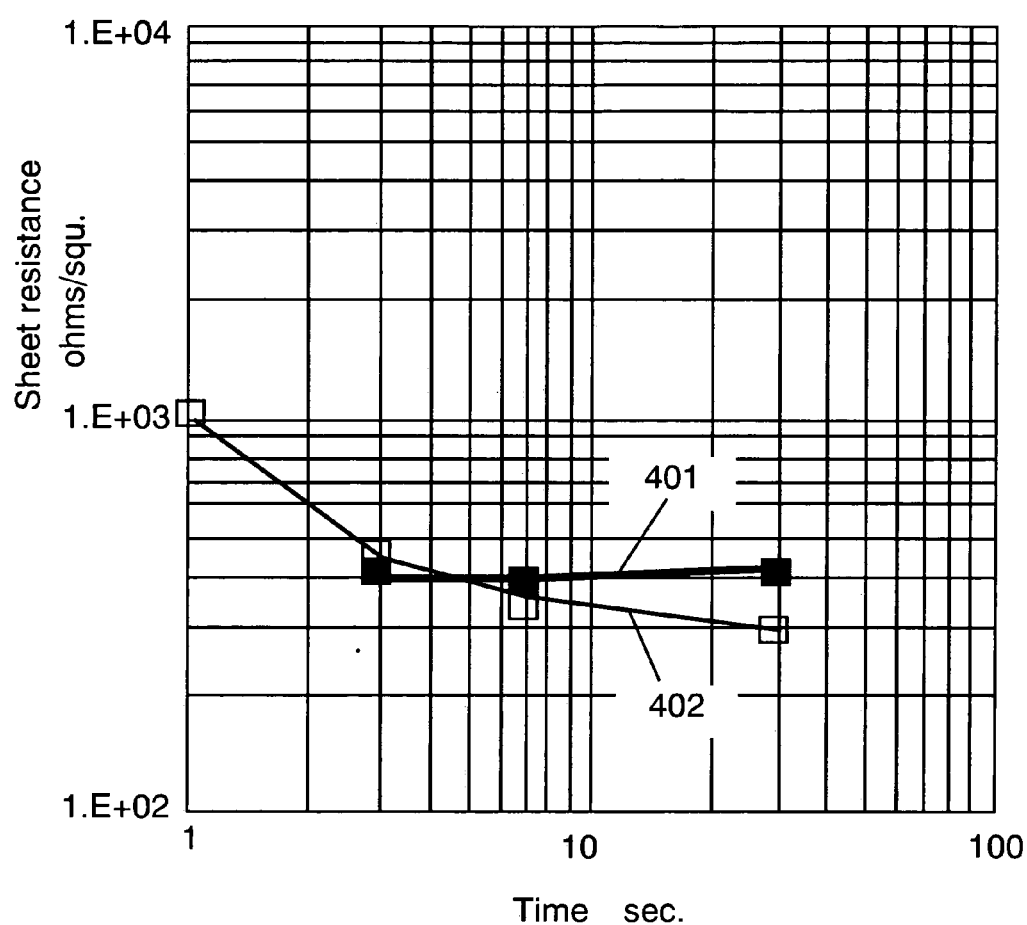
FIG. 4 is a graph illustrating the relation between bias voltage application time and sheet resistance in the embodiment of the present invention.
Figure 5A:
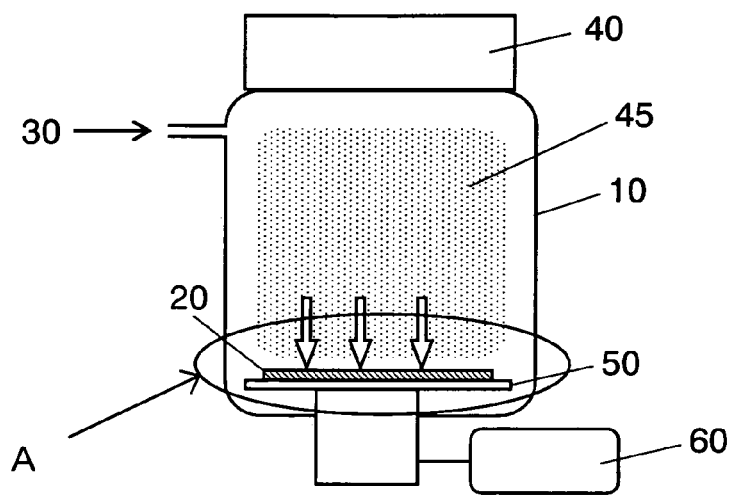
FIG. 5A is a conventional plasma-doping apparatus.
Figure 5B:
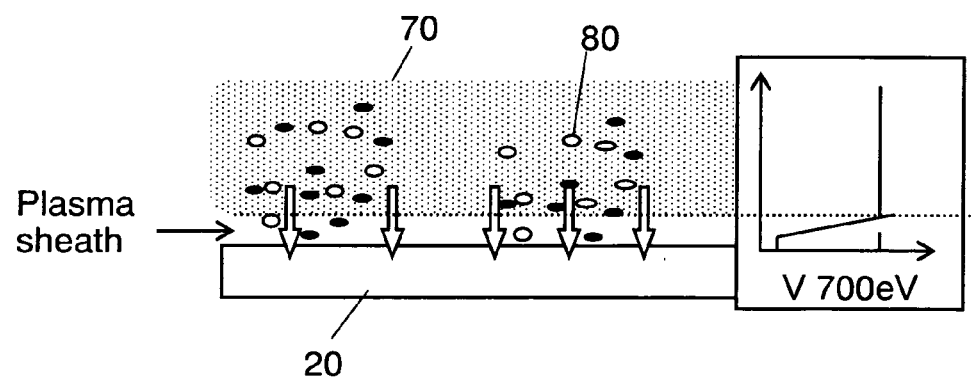
FIG. 5B is a magnified view of area A in FIG. 5A.

FIG. 4 shows the relation between the bias voltage application time (horizontal axis) and sheet resistance (vertical axis). Plotted line 401 indicates the measurement result when the $B_2H_6$ gas concentration is 0.29% (i.e., a He gas concentration of 99.71%). Plotted line 402 indicates the measurement result when the $B_2H_6$ gas concentration is 0.025% (i.e., a He gas concentration of 99.975%). As shown by plotted line 401, sheet resistance remains unchanged at about 400 Ω/square, even when the bias voltage application time is changed to 3 sec, 7 sec and 30 sec at a $B_2H_6$ gas concentration of 0.29%. On the other hand, as shown by plotted line 402, the sheet resistance is successfully changed to 1020, 460, 350 and 290 Ω/square when the bias voltage application time is changed to 1, 3, 7, and 30 sec where the $B_2H_6$ gas concentration is 0.025%. The boron dose after plasma doping has also changed to 2.2E14, 6.0E14, 6.5E14 and 8.0E14 atoms/cm$^2$. The boron concentration becomes 1E18 atoms/cm$^3$ when the depth is 4 to 6 nm or less. Accordingly, a dose is controllable by changing the bias voltage application time within 30 sec or 15 sec. The dose is thus easily controllable while securing the throughput required in the industrial field.

6. Application to Device

A device is made using the plasma-doping apparatus shown in FIG. 1. A mask is patterned in advance and n-Si (100) wafer 113 is placed on susceptor 114. After loading susceptor 114 into reactor chamber 115, conductance valve 107 is opened, and the pressure inside reactor chamber 115 is reduced using turbo pump 106. When the pressure reaches a predetermined degree of vacuum, Ar gas is introduced to reactor chamber 115 via mass flow controller 104 to generate Ar plasma by applying the source power and discharging. Helium gas is then introduced via mass flow controller 105 and Ar gas supply is stopped at the same time to generate He plasma. Helicon-wave source power is 1500 W. While He plasma is being generated, a gas mixture of 0.025% $B_2H_6$ gas and 99.975% He gas is introduced to generate mixed plasma at a pressure of 0.8 Pa. A bias voltage of −60 V is applied for 30 sec for doping. After treatment, wafer 113 is taken out and thermally treated. A resistance pattern equivalent to sheet resistance of 290 Ω/square is formed on wafer 113 after thermal treatment. In the same way, a pattern with different sheet resistance is formed by changing the application time of the −60 V bias voltage for doping.

As described above, the plasma doping method of the present invention is applicable to the manufacture of electric and electronic devices such as semiconductor devices and liquid crystal panels, and passive electric devices such as capacitors, resistors and coils.

INDUSTRIAL APPLICABILITY

As described above, the present invention enhances safety by diluting $B_2H_6$ as much as possible, and generates and maintains stable plasma without reducing doping efficiency. Furthermore, the present invention offers a plasma doping method by which the dopant implantation amount can be readily controlled.

The invention claimed is:

1. A plasma doping method comprising:
generating mixed plasma of a mixed substance made of a first substance containing impurity to be doped and a second substance having higher ionization energy than the first substance, the mixed plasma having ion current density of 1.1 mA/cm$^2$ or higher; and
doping an impurity on a substrate using the mixed plasma; wherein an amount of the second substance is larger than that of the first substance; the first substance is $B_2H_6$; the second substance is rare gas; a concentration of $B_2H_6$ in the mixed substance is below 0.05%; and a dose of impurity on the substrate is controllable by changing application time of bias voltage in the step of doping.

2. The plasma doping method as defined in claim 1, wherein the first substance is $B_2H_6$; the second substance is rare gas; a concentration of $B_2H_6$ in the mixed substance is below 0.5%; and the step of generating plasma is a step of generating helicon plasma.

3. The plasma doping method as defined in claim 2, wherein the rare gas is He.

4. The plasma doping method as defined in claim 2, wherein the first substance is selected from at least one of $BF_3$ and $B_{10}H_{14}$ instead of $B_2H_6$, and the second substance is selected from at least one of H, N, O, Cl, $H_2$, NO, $N_2$, $O_2$, CO, $CO_2$, $H_2O$, $SF_6$, $Br_2$ and $Cl_2$ instead of the rare gas and a concentration of the first substance in the mixed substance is below 0.05%.

5. The plasma doping method as defined in claim 1, wherein the step of generating plasma is generating the plasma with electron temperature of 6.0 eV or higher.

6. The plasma doping method as defined in claim 1, wherein the rare gas is He.

7. The plasma doping method as defined in claim 1, wherein the bias voltage is −60 V or less.

8. The plasma doping method as defined in claim 1 further comprising a preliminary step before the step of generating mixed plasma, the preliminary step being generating plasma of a third substance having smaller ionization energy than the first substance, and the preliminary step and the step of generating mixed plasma being consecutive.

9. The plasma doping method as defined in claim 1, wherein the first substance is selected from at least one of $BF_3$ and $B_{10}H_{14}$ instead of $B_2H_6$, and the second substance is selected from at least one of H, N, O, Cl, $H_2$, NO, $N_2$, $O_2$, CO, $CO_2$, $H_2O$, $SF_6$, $Br_2$ and $Cl_2$ instead of the rare gas and a concentration of the first substance in the mixed substance is below 0.05%.

10. The plasma doping method as defined in claim 1, wherein the method is applied to a manufacture of electric and electronic devices such as semiconductor devices and liquid crystal panels, and passive electric devices such as capacitors, resistors and coils.

11. A plasma doping method comprising:
generating mixed plasma of a mixed substance including a first substance containing impurity to be doped and a second substance having higher ionization energy than the first substance, the mixed plasma having electron temperature of 6.0 eV or higher; and
doping impurity on a substrate using the mixed plasma; wherein an amount of the second substance is larger than that of the first substance; the first substance is selected from at least one of $B_2H_6$, $BF_3$ and $B_{10}H_{14}$; the second substance is selected from at least one of He, Ne, Rn, AR, H, N, O, Kr, Xe, Cl, $H_2$, NO, $N_2$, $O_2$, CO, $CO_2$, $H_2O$, $SF_6$, $Br_2$ and $Cl_2$; a concentration of the first substance in the mixed substance is below 0.05%; and a dose of impurity on the substrate is controllable by changing application time of bias voltage in the step of doping.

* * * * *